United States Patent
Okamoto

(10) Patent No.: US 10,515,842 B2
(45) Date of Patent: Dec. 24, 2019

(54) SUBSTRATE TRANSFER HAND WITH TRANSVERSE HAND SUPPORTS

(71) Applicant: DAIHEN CORPORATION, Osaka-shi, Osaka (JP)

(72) Inventor: Kentaro Okamoto, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

(21) Appl. No.: 16/072,045

(22) PCT Filed: Jan. 27, 2017

(86) PCT No.: PCT/JP2017/002909
§ 371 (c)(1),
(2) Date: Jul. 23, 2018

(87) PCT Pub. No.: WO2017/131148
PCT Pub. Date: Aug. 3, 2017

(65) Prior Publication Data
US 2019/0035670 A1    Jan. 31, 2019

(30) Foreign Application Priority Data

Jan. 29, 2016 (JP) ................. 2016-015476

(51) Int. Cl.
*H01L 21/687* (2006.01)
*B25J 11/00* (2006.01)
(Continued)

(52) U.S. Cl.
CPC .. *H01L 21/68707* (2013.01); *H01L 21/67742* (2013.01); *H05K 9/0079* (2013.01)

(58) Field of Classification Search
CPC .................. H01L 21/68707; H01L 21/67742
(Continued)

(56) References Cited

U.S. PATENT DOCUMENTS 5,380,137 A * 1/1995 Wada ................ H01L 21/67309
414/172
6,062,241 A * 5/2000 Tateyama .............. B25B 11/007
134/133
(Continued)

FOREIGN PATENT DOCUMENTS

JP    2001-179672 A    7/2001
JP    2003-243482 A    8/2003
(Continued)

OTHER PUBLICATIONS

Search Report issued in PCT/JP2017/002909, dated Apr. 18, 2017 (2 pages).

*Primary Examiner* — Paul T Chin
(74) *Attorney, Agent, or Firm* — Hamre, Schumann, Mueller & Larson, P.C.

(57) ABSTRACT

A substrate transfer hand includes a longitudinal hand support extending in a longitudinal direction, and first and second transverse hand supports coupled to the longitudinal hand support and extending transversely to the longitudinal direction of the longitudinal hand support. Each of the first transverse hand supports includes a plurality of first contact points aligned in a direction in which the first transverse hand support extends and capable of contacting a substrate. The maximum height position of the first contact points is a first height. Each of the second transverse hand supports includes a plurality of second contact points aligned in a direction in which the second transverse hand support extends and capable of contacting the substrate. The maximum height position of the second contact points is a second height that is lower than the first height.

18 Claims, 15 Drawing Sheets

(51) Int. Cl.
*B25J 15/00* (2006.01)
*H01L 21/677* (2006.01)
*H05K 9/00* (2006.01)

(58) Field of Classification Search
USPC .......................................................... 294/213
See application file for complete search history.

(56) References Cited

U.S. PATENT DOCUMENTS

| | | | |
|---|---|---|---|
| 7,520,545 B2 * | 4/2009 | Kim ..................... | B65G 49/061 294/213 |
| 8,465,072 B2 * | 6/2013 | Wu ...................... | B65G 49/067 294/213 |
| 8,814,239 B2 * | 8/2014 | Forderhase ....... | H01L 21/67046 294/213 |
| 9,061,423 B2 * | 6/2015 | Pergande ............. | B25J 15/0014 |
| 2002/0197139 A1 | 12/2002 | Chinbe et al. | |
| 2006/0284434 A1 * | 12/2006 | Yang ................... | B65G 49/061 294/119.1 |
| 2007/0246957 A1 * | 10/2007 | Liu ................... | H01L 21/68707 294/213 |

FOREIGN PATENT DOCUMENTS

| | | |
|---|---|---|
| JP | 2005-223204 A | 8/2005 |
| JP | 2007-8700 A | 1/2007 |
| JP | 2009-141091 A | 6/2009 |
| JP | 4681029 B2 | 5/2011 |
| WO | 2004/113205 A1 | 12/2004 |

\* cited by examiner

SUBSTRATE TRANSFER HAND WITH TRANSVERSE HAND SUPPORTS

TECHNICAL FIELD

The present invention relates to a substrate transfer hand and in particular relates to a hand suitable for transferring a large and thin substrate.

BACKGROUND ART

In recent years, larger and thinner substrates have been manufactured by semiconductor manufacturing equipment. A hand for transferring such a large and thin substrate is proposed in Patent Document 1.

The hand 1 disclosed in Patent Document 1 includes a longitudinal hand support and a plurality of transverse hand supports extending transversely from the longitudinal hand support, and is configured to minimize the warping of the substrate supported on the hand.

However, to reduce the warping and maintain the horizontal posture of the supported substrate, both of the longitudinal hand support and the transverse hand supports need to have a large number of support pins of the same height.

When a substrate is supported with a large number of support pins, the risk of electrostatic discharge (ESD) increases, which is undesirable for conducting processing on the substrate. Moreover, since a substrate, which usually has a low rigidity, is supported to have a horizontal posture with a large number of support pins, unnecessary vibrations may occur in the substrate when an external force is applied. This is also undesirable for conducting processing on the substrate.

Patent Document 1: Japanese Patent No. 4681029

SUMMARY OF THE INVENTION

The present invention has been proposed under the above circumstances. It is therefore an object of the present invention to provide a substrate transfer hand that is capable of supporting a substrate in a rigid state while reducing the contact points with the substrate.

To solve the above problems, the following technical means is employed.

A substrate transfer hand provided by the present invention is a substrate transfer hand for supporting and transferring a substrate. The hand includes a plurality of transverse hand supports extending, from a longitudinal hand support extending in a longitudinal direction, transversely to the longitudinal direction of the longitudinal hand support. The plurality of transverse hand supports include a plurality of first transverse hand supports and a plurality of second transverse hand supports. Each of the first transverse hand supports includes one or a plurality of first contact points capable of contacting the substrate, and the maximum height position of the first contact points is a first height. Each of the second transverse hand supports includes one or a plurality of second contact points capable of contacting the substrate, and the maximum height position of the second contact points is a second height that is lower than the first height.

In a preferred embodiment, each of the first contact points comprises a top of a pin that projects upward, and each of the second contact points comprises a top of a pin that projects upward.

In a preferred embodiment, each of the first contact points comprises a top of a bulging portion formed at the first transverse hand support, whereas each of the second contact points comprises a top of a bulging portion formed at the second transverse hand support.

In a preferred embodiment, the first transverse hand supports and the second transverse hand supports are arranged alternately in the longitudinal direction.

In a preferred embodiment, the plurality of first contact points provided at each of the first transverse hand supports are equal in height, whereas at least one of the plurality of second contact points provided at each of the second transverse hand supports has a height lower than the second height.

In a preferred embodiment, the longitudinal hand support includes a plurality of third contact points capable of contacting the substrate, and the maximum height position of the third contact points is equal to or higher than the second height.

In a preferred embodiment, the substrate transfer hand includes a plurality of longitudinal hand supports.

In a preferred embodiment, the substrate transfer hand includes a pair of longitudinal hand supports that are laterally aligned.

In a preferred embodiment, the plurality of transverse hand supports extend laterally outward from each of the longitudinal hand supports.

In a preferred embodiment, the plurality of transverse hand supports extend laterally inward from each of the longitudinal hand supports.

In a preferred embodiment, the plurality of transverse hand supports extend from each of the longitudinal hand supports laterally in opposite directions.

According to the substrate transfer hand having the above configuration, the heights of the contact points with a substrate, which are provided at the plurality of first transverse hand supports and the second transverse hand supports are not equal to each other, and the maximum height position of the second contact points at the second transverse hand supports is set to be lower than the height of the first contact points at the first transverse hand supports. Thus, the substrate is supported on the hand with a portion thereof intentionally warped. This rather enhances the rigidity of the substrate in the supported state, so that the supported state is stabilized, and generation of undesirable vibration is reduced. Since the number of contact points with the substrate is reduced, the risk of electrostatic discharge (ESD) is not increased.

MODE FOR CARRYING OUT THE INVENTION

Preferred embodiments of the present invention are described below with reference to the accompanying drawings.

FIGS. 1-4 show a substrate transfer hand 1A according to a first embodiment of the present invention.

The substrate transfer hand 1A may be used to carry a substrate, such as a large glass substrate having a size of 1800×1500 mm, for example, into and out of a substrate storage cassette or a process chamber. The substrate transfer hand 1A may also be supported by an appropriate movement means to be moved in a predetermined direction. For example, as an end effector of an articulated robot RB (FIG. 4), the substrate transfer hand 1A may be moved in x, y and z directions and also rotated about the z axis.

The substrate transfer hand 1A includes a base 10, longitudinal hand supports 20a, and a plurality of transverse hand supports 31a and 32a coupled to each of the longitudinal hand supports 20a.

Figure 4:
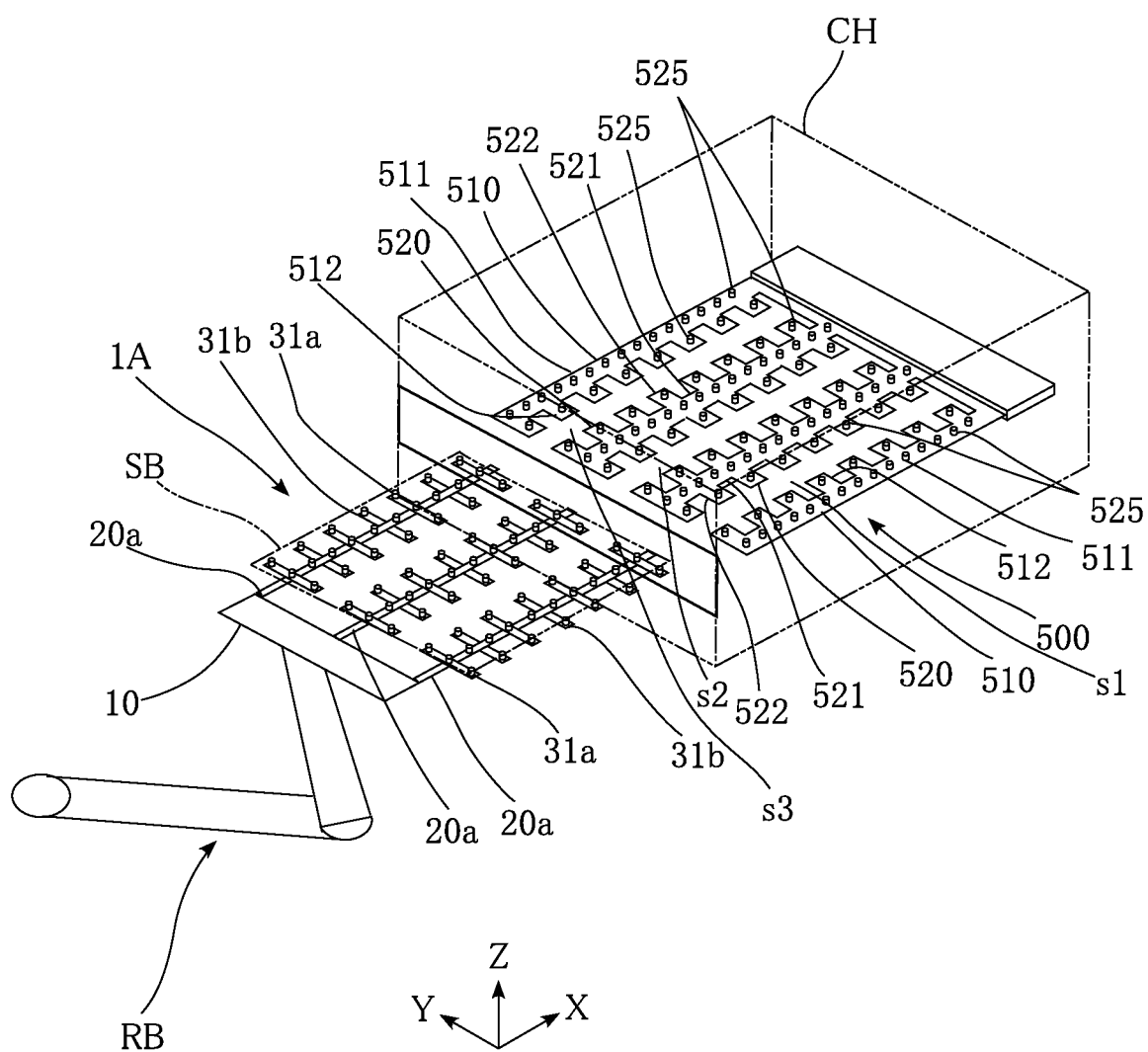
FIG. 4 is a perspective view showing an example use of the substrate transfer hand shown in FIG. 1.
Figure 5:
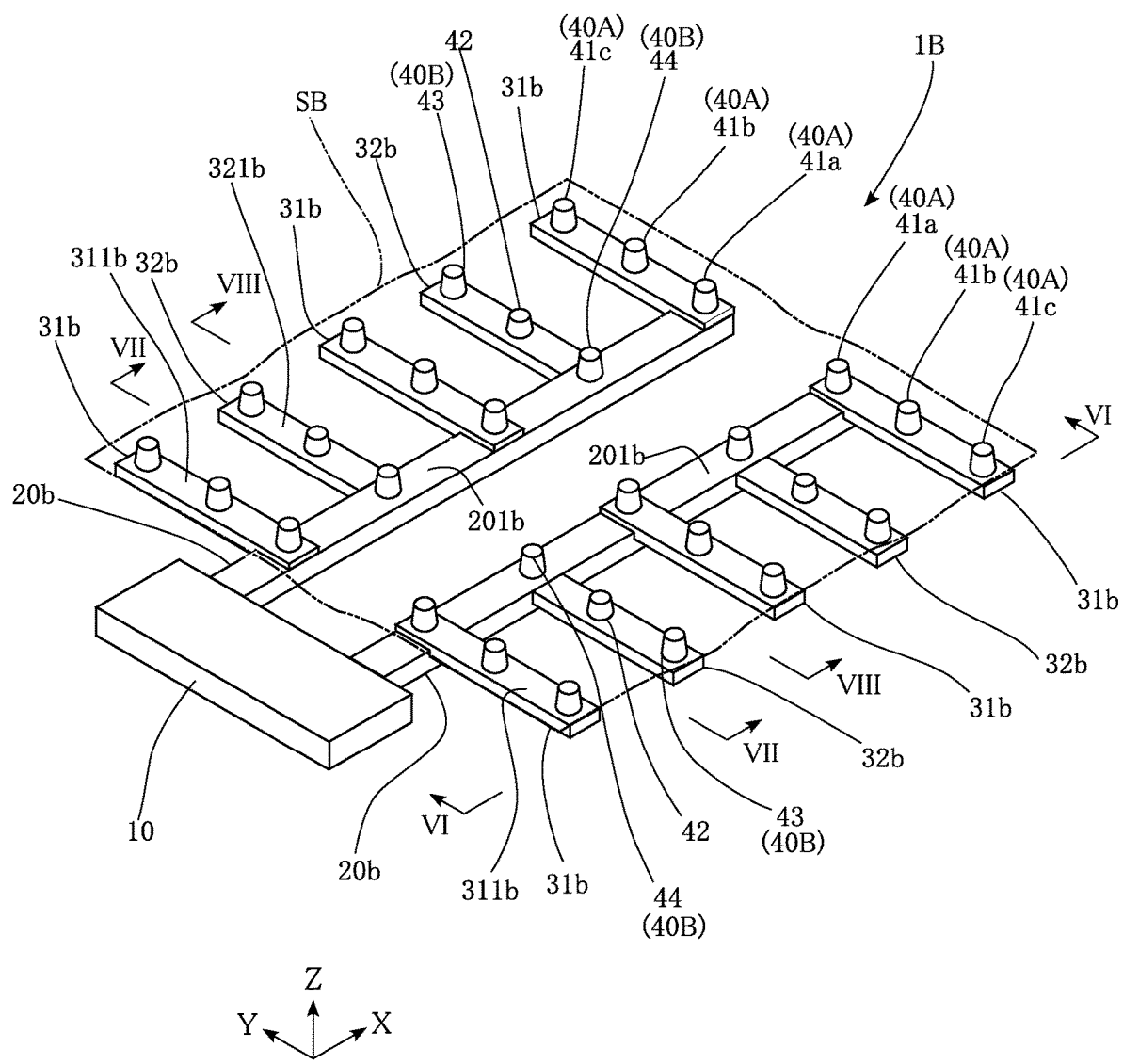
FIG. 5 is an overall perspective view of a substrate transfer hand according to a second embodiment of the present invention.

The base 10 is in the form of a horizontal plate having a predetermined width and mounted to a moving means such as an articulated robot RB (FIG. 4). The longitudinal hand supports 20a extend from the base 10 linearly within a horizontal plane in a longitudinal direction. In the present embodiment, three longitudinal hand supports 20a extend in parallel to each other at regular intervals. In the present embodiment, the longitudinal hand supports 20a are flat, bar-like members each having a constant width and a constant thickness. To each of the longitudinal hand supports 20a is coupled a plurality of first transverse hand supports 31a and a plurality of second transverse hand supports 32a, which are arranged alternately in the longitudinal direction of the longitudinal hand support 20a. Each of the first transverse hand supports 31a and each of the second transverse hand supports 32a have a predetermined length in a horizontal direction perpendicular to the longitudinal hand supports 20a, and is coupled to a longitudinal hand support 20a at its middle point in the longitudinal direction thereof. In the present embodiment, the first transverse hand supports 31a and the second transverse hand supports 32a are plate-like members each having a constant width and a constant thickness. The first transverse hand supports 31a and the second transverse hand supports 32a are arranged at regular intervals in the longitudinal direction of the longitudinal hand supports 20a. The base 10, the longitudinal hand supports 20a, the first transverse hand supports 31a and the second transverse hand supports 32a are formed of a hard resin, ceramics, or a metal such as aluminum.

Figure 1:
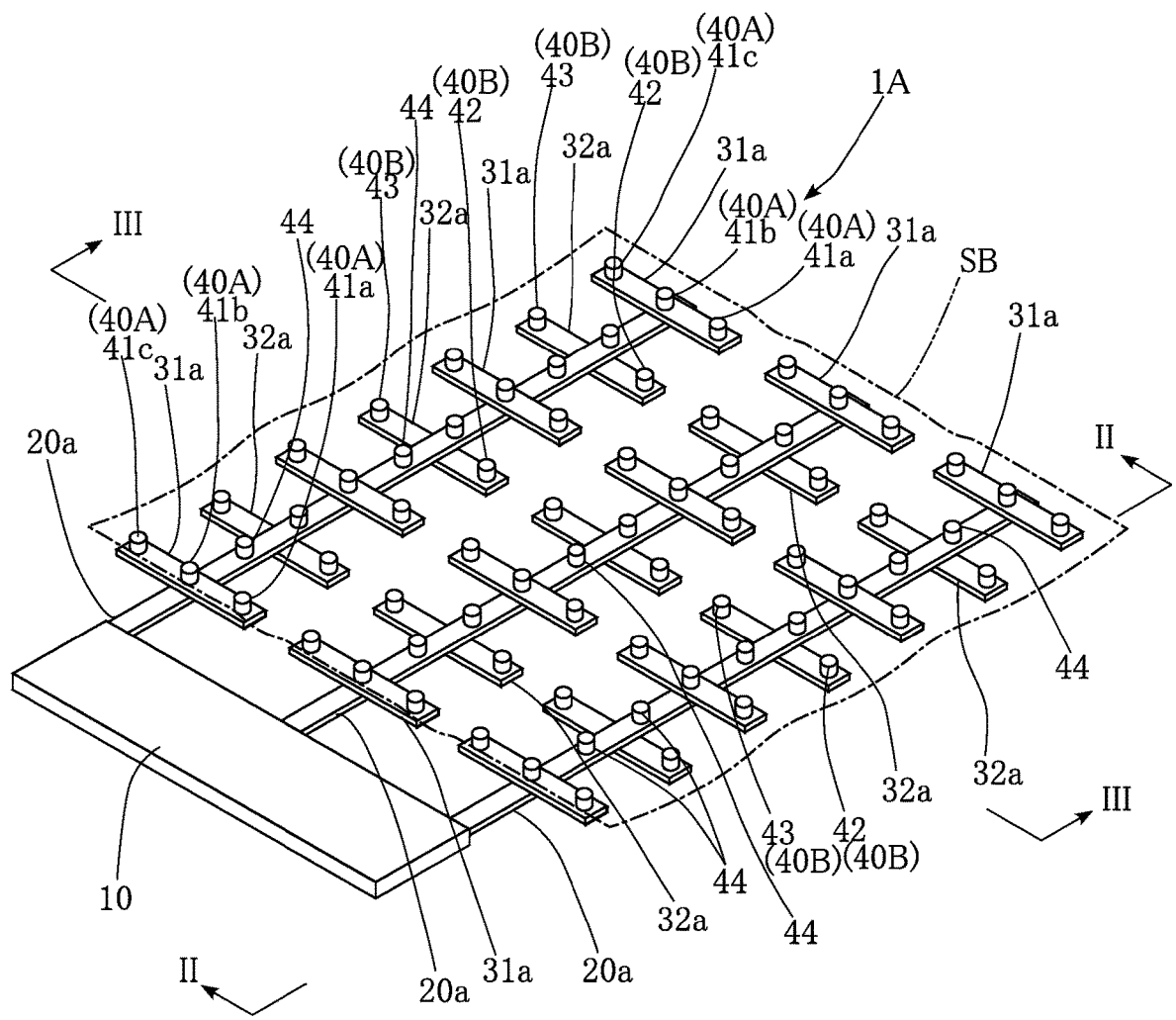
FIG. 1 is an overall perspective view of a substrate transfer hand according to a first embodiment of the present invention.
Figure 2:
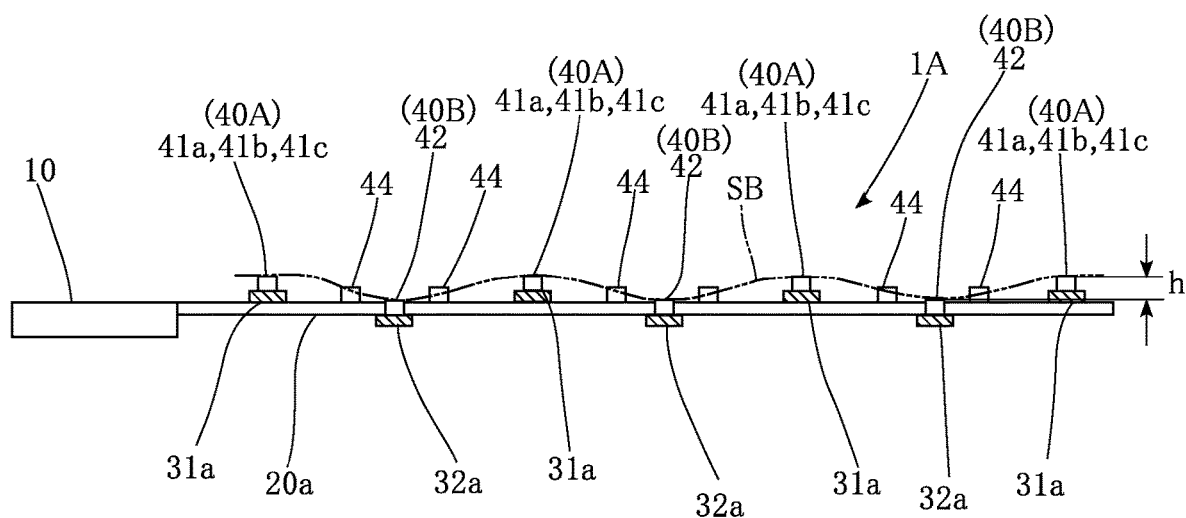
FIG. 2 is a sectional view taken along line II-II in FIG. 1.

The first transverse hand supports 31a are located higher than the second transverse hand supports 32a by a predetermined height h (FIG. 2). In the present embodiment, such a height difference in the vertical direction between the first transverse hand supports 31a and the second transverse hand supports 32a is provided by coupling the first transverse hand supports 31a to the upper surface of a longitudinal hand support 20a while coupling the second transverse hand supports 32a to the lower surface of a longitudinal hand support 20a.

The first transverse hand supports 31a and the second transverse hand supports 32a are provided with pins 41a, 41b, 41c, 42 and 43 projecting from the hand supports. These pins serve as contact points with a substrate SB placed on the substrate transfer hand 1A. These pins 41a, 41b, 41c, 42 and 43 may be formed of, for example, resin, rubber, or the like. It is desirable to form these pins from a material having a suitable elasticity. Each of the first transverse hand supports 31a is provided with three pins 41a, 41b and 41c at three positions, namely opposite ends and the center in its longitudinal direction. The position of each pin 41b at the center overlaps a longitudinal hand support 20a. These three pins 41a, 41b and 41c have the same height dimension and their tops function as the first contact points 40A according to the present invention. Each of the second transverse hand supports 32a is provided with two pins 42 and 43 at opposite ends in its longitudinal direction. The two pins 42 and 43 have the same height dimension, which is equal to the height dimension of the pins 41a, 41b and 41c provided at the first transverse hand supports 31a. The tops of these two pins 42 and 43 function as the second contact points 40B according to the present invention. Since the first transverse hand supports 31a are positioned higher than the second transverse hand supports 32a as described above, the height position of the first contact points 40A is located higher than the height position of the second contact points 40B by the predetermined height h.

In the present embodiment, the longitudinal hand supports 20a are also provided with pins 44 that project from the longitudinal hand supports. The tops of these pins 44 function as third contact points. In the present embodiment, on each longitudinal hand support 20a, the pins 44 are provided at positions that divide the distance between two adjacent pins 41b provided at the centers of the first transverse hand supports 31a equally into three parts. The pins 44 have a height dimension equal to that of the pins 41a, 41b and 41c provided at the first transverse hand supports 31a and pins 42 and 43 provided at the second transverse hand supports 32a. However, the tops of the pins 44 are located lower than the tops of the pins 41a, 41b and 41c (first contact points 40A) provided at the first transverse hand supports 31a and higher than the tops of the pins 42 and 43 (second contact points 40B) provided at the second transverse hand supports 32a by an amount corresponding to the thickness of the first transverse hand supports 31a.

The advantages of the substrate transfer hand 1A according to the present embodiment are described below.

FIG. 4 illustrates a schematic configuration in an instance where the above substrate transfer hand 1A is used to transfer a substrate SB to a substrate receiving part 500 in a processing apparatus CH. The substrate receiving part 500 includes a pair of lateral supports 510 and two intermediate supports 520 located between the lateral supports. Each of the lateral supports 510 is shaped like a comb, having a longitudinal support part 511 and a plurality of transverse support parts 512 arranged at regular intervals to extend inward from the longitudinal support part 511. Each of the two intermediate supports 520 has a longitudinal support part 521 and a plurality of transverse support parts 522 extending from the longitudinal support part 521 laterally in opposite directions. The gaps s1, s2 and s3 between the lateral supports 510 and the intermediate supports 520 and between the two intermediate supports 520 are so set as to allow the substrate transfer hand 1A to pass through these gaps in the vertical direction. The lateral supports 510 and the two intermediate supports 520 are provided with a plurality of pins 525 projecting from their upper surfaces, which are capable of coming into contact with a substrate SB to support the substrate. The substrate SB advanced above the substrate receiving part 500 as placed on the substrate transfer hand 1A is transferred onto the substrate receiving part 500 when the substrate transfer hand 1A moves below the substrate receiving part 500 by passing through the spaces s1, s2 and s3. The substrate SB transferred onto the substrate receiving part 500 is subjected to a next process as desired.

Figure 3:
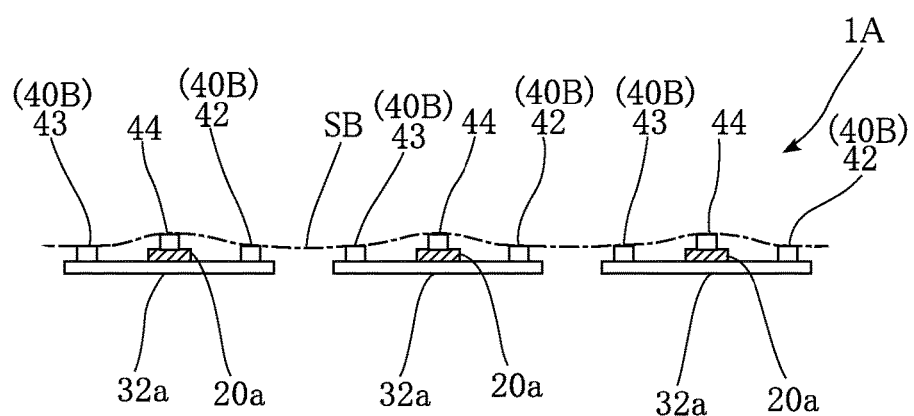
FIG. 3 is a sectional view taken along line III-III in FIG. 1.

When a substrate SB is placed onto the substrate transfer hand 1A according to the present embodiment, the top ends of the plurality of pins 41a, 41b, 41c, 42, 43 and 44 provided at the first transverse hand supports 31a, the second transverse hand supports 32a or the longitudinal hand supports 20a come into contact with the substrate SB. Since the top ends of the pins 41a, 41b, 41c, 42, 43 and 44, i.e., the contact points with the substrate SB include the first contact points 40A located at a high position and the second contact points 40B located lower than the first contact points, the substrate SB is supported in an intentionally warped state in contact with the tops of the pins 41a, 41b, 41c, 42, 43 and 44. The first transverse hand supports 31a having the first contact points 40A and the second transverse hand supports 32a having the second contact points 40B lower than the first contact points at their opposite ends are arranged alternately in the longitudinal direction of the longitudinal hand supports 20a. With such an arrangement, as shown in FIGS. 2 and 3, the substrate SB in the supported state is warped in such a manner that the portions near the top ends of the second transverse hand supports 32a are low in the section in a side view direction as well as in the cross section. Such warping or deformation provides the substrate SB with certain rigidity, allowing the substrate to be held in a stable condition on the substrate transfer hand 1A. Thus, generation of vibration on the substrate SB during the movement of the substrate transfer hand 1A is eliminated or reduced. Since the substrate SB is supported by the top ends of a relatively small number of pins 41a, 41b, 41c, 42, 43 and 44, the risk of electrostatic discharge (ESD) is not increased.

FIGS. 5-8 show a substrate transfer hand 1B according to a second embodiment of the present invention. In these figures, the elements that are identical or similar to those of the substrate transfer hand 1A according to the first embodiment shown in FIGS. 1-4 are designated by the same reference signs as those used for the first embodiment.

The substrate transfer hand 1B includes a base 10, longitudinal hand supports 20b, and a plurality of transverse hand supports 31b and 32b coupled to each of the longitudinal hand supports 20b.

The base 10 is in the form of a horizontal plate having a predetermined width and mounted to a moving means such as an articulated robot RB. The longitudinal hand supports 20b extend from the base 10 linearly within a horizontal plane in a longitudinal direction. In the present embodiment, two longitudinal hand supports 20b extend in parallel to each other with a constant space between them. In the present embodiment, the longitudinal hand supports 20b are flat, bar-like members each having a constant width and a constant thickness. To each of the longitudinal hand supports 20b is coupled a plurality of first transverse hand supports 31b and a plurality of second transverse hand supports 32b, which are arranged alternately in the longitudinal direction of the longitudinal hand support 20b. Each of the first transverse hand supports 31b and each of the second transverse hand supports 32b have a predetermined length in a horizontal direction perpendicular to the longitudinal hand supports 20b, and is coupled to a longitudinal hand support 20b to extend laterally outward from the longitudinal hand support. In the present embodiment, the first transverse hand supports 31b and the second transverse hand supports 32b are plate-like members each having a constant width and a constant thickness. The first transverse hand supports 31b and the second transverse hand supports 32b are arranged at regular intervals in the longitudinal direction of the longitudinal hand supports 20b. The base 20, the longitudinal hand supports 20b, the first transverse hand supports 31b and the second transverse hand supports 32b are formed of a hard resin, ceramics, or a metal such as aluminum.

Figure 6:
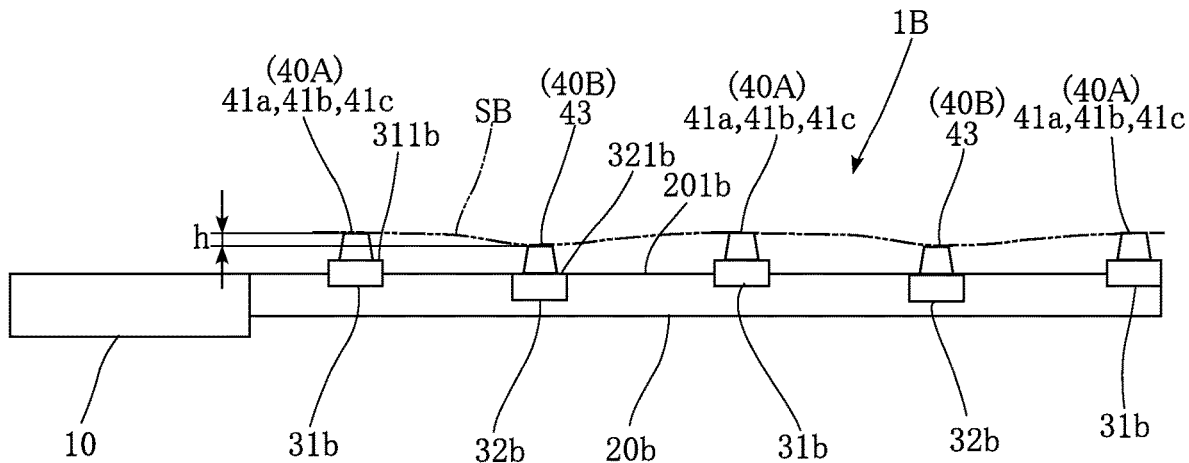
FIG. 6 is a perspective view along line VI-VI in FIG. 5.
Figure 8:
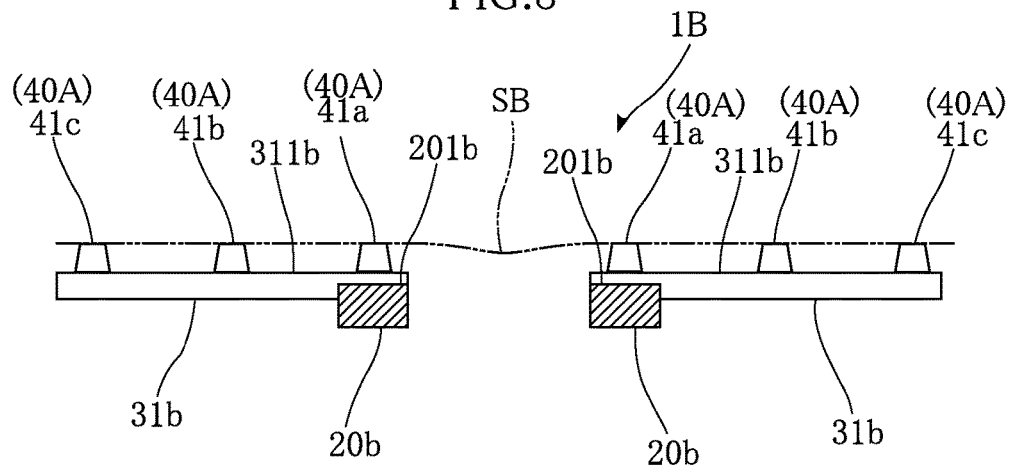
FIG. 8 is a sectional view taken along line VIII-VIII in FIG. 5.
Figure 9:
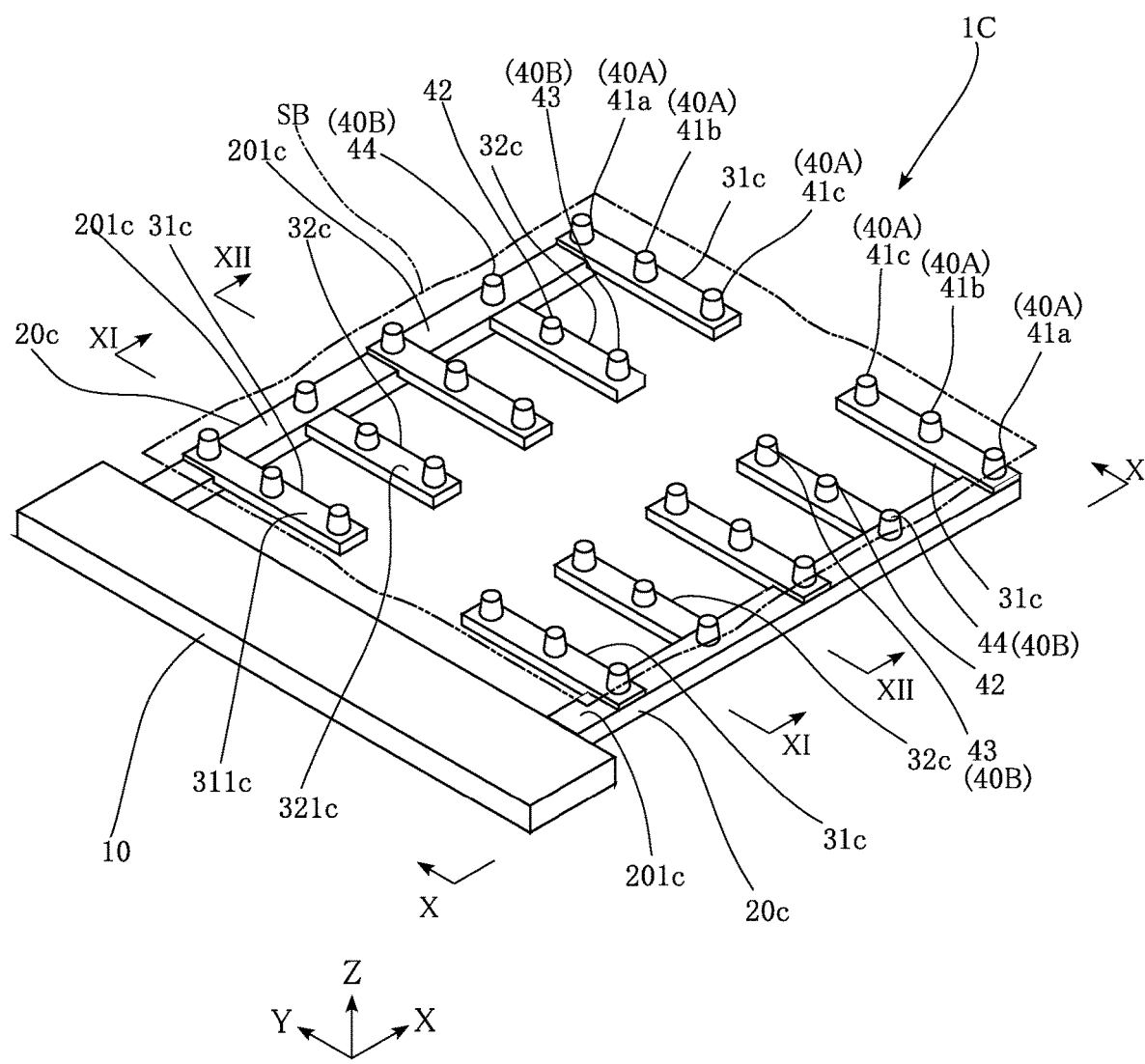
FIG. 9 is an overall perspective view of a substrate transfer hand according to a third embodiment of the present invention.

The first transverse hand supports 31b are located higher than the second transverse hand supports 32b by a predetermined height h (FIG. 6). In the present embodiment, each of the first transverse hand supports 31b has a base end of which lower side is cut out to form an L shape, and is coupled to a longitudinal hand support 20b in such a manner that the cut-out part comes into contact with the upper surface 201b and a side surface of the longitudinal hand support 20b. Thus, the upper surfaces 311b of the first transverse hand supports 31b are located higher than the upper surfaces 201b of the longitudinal hand supports 20b (FIGS. 6 and 8). On the other hand, each of the second transverse hand supports 32b is coupled to a longitudinal hand support 20b in such a manner that its upper surface 321b is flush with the upper surface 201b of the longitudinal hand support 20b. Thus, the upper surfaces 311b of the first transverse hand supports 31b are located higher than the upper surfaces 321b of the second transverse hand supports 32b.

The first transverse hand supports 31b and the second transverse hand supports 32b are provided with pins 41a, 41b, 41c, 42 and 43 projecting from the hand supports. These pins serve as contact points with a substrate SB placed on the substrate transfer hand 1B. Similarly to the above-described first embodiment, these pins 41a, 41b, 41c, 42 and 43 may be formed of, for example, resin, rubber, or the like, and it is desirable to form these pins from a material having a suitable elasticity. Each of the first transverse hand supports 31b is provided with three pins 41a, 41b and 41c at three positions, namely at the base end, the distal end and the center in its longitudinal direction. The position of each pin 41a at the base end overlaps a longitudinal hand support 20b. These three pins 41a, 41b and 41c have the same height dimension and their tops function as first contact points 40A according to the present invention. Each of the second transverse hand support 32b is provided with two pins 42 and 43 at its distal end and the center in its longitudinal direction. Each of the longitudinal hand supports 20b, which adjoins the base ends of the second transverse hand supports 32b, is also provided with pins 44. The pins 44 on the longitudinal hand supports 20b and the pins 43 at the distal ends of the second transverse hand support 32b have the same height dimension. Further, these pins 43 and 44 are identical with, and hence, have the same top height position as the three pins 41a, 41b and 41c provided at each first transverse hand support 31b. However, since the second transverse hand supports 32b are located lower than the first transverse hand supports 31b by the predetermined height h as described above, the tops of the pins 43 and 44 are located lower than the tops of the pins 41a, 41b and 41c (the first contact points 40A) provided at the first transverse hand supports 31b. The tops of these two pins 43 and 44 function as the second contact points 40B according to the present invention. Note that, in the present embodiment, the height of the pin 42 provided at the center of each second transverse hand support 32b is set lower than the top height position of the two pins 43 and 44 constituting the second contact points 40B.

The advantages of the substrate transfer hand 1B according to the present embodiment are described below.

Figure 7:
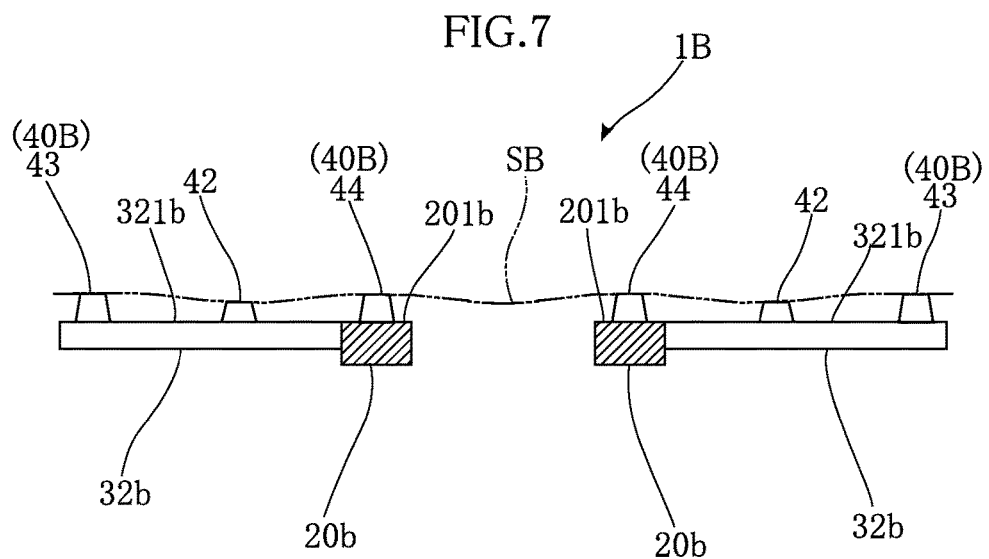
FIG. 7 is a sectional view taken along line VII-VII in FIG. 5.

When a substrate SB is placed onto the substrate transfer hand 1B according to the present embodiment, the top ends of the plurality of pins 41a, 41b, 41c, 42, 43 and 44 provided at the first transverse hand supports 31b, the second transverse hand supports 32b or the longitudinal hand supports 20b come into contact with the substrate SB. Since the top ends of the pins 41a, 41b, 41c, 42, 43 and 44, i.e., the contact points with the substrate SB include the first contact points 40A located at a high position and the second contact points 40B located lower than the first contact points, the substrate SB is supported in an intentionally warped state in contact with the tops of the pins 41a, 41b, 41c, 42, 43 and 44. The first transverse hand supports 31b having the first contact points 40A and the second transverse hand supports 32b having the second contact points 40B lower than the first contact points are arranged alternately in the longitudinal direction of the longitudinal hand supports 20b. With such an arrangement, as shown in FIG. 6, the supported substrate SB is warped or deformed into a waveform, in side view of the substrate transfer hand 1B. Further, a gap is provided between the two longitudinal hand supports 20b, and of the three pins 42, 43 and 44 aligned along each second transverse hand support 32b, the top of the pin 42 at the center is lower than the tops of the pin 44 on the longitudinal hand support 20b and the pin 43 at the distal end of the second transverse hand support 32b. Thus, as shown in FIG. 7, in the cross section along the second transverse hand support 32b again, the substrate is warped or deformed into a waveform. Such warping or deformation provides the substrate SB with certain rigidity, allowing the substrate to be held in a stable condition on the substrate transfer hand 1B. Thus, generation of vibration on the substrate SB during the movement of the substrate transfer hand 1B is eliminated or reduced. Since the substrate SB is supported by the top ends of a relatively small number of pins 41a, 41b, 41c, 42, 43 and 44, the risk of electrostatic discharge (ESD) is not increased.

FIGS. 9-12 show a substrate transfer hand 1C according to a third embodiment of the present invention. In these figures, the elements that are identical or similar to those of the substrate transfer hand 1A according to the first embodiment shown in FIGS. 1-4 are designated by the same reference signs as those used for the first embodiment.

The substrate transfer hand 1C includes a base 10, longitudinal hand supports 20c, and a plurality of transverse hand supports 31c and 32c coupled to each of the longitudinal hand supports 20c.

The base 10 is in the form of a horizontal plate having a predetermined width and mounted to a moving means such as an articulated robot. The longitudinal hand supports 20c extend from the base 10 linearly within a horizontal plane in a longitudinal direction. In the present embodiment, two longitudinal hand supports 20c extend in parallel to each other with a constant space between them. In the present embodiment, the longitudinal hand supports 20c are flat, bar-like members each having a constant width and a constant thickness. To each of the longitudinal hand supports 20c is coupled a plurality of first transverse hand supports 31c and a plurality of second transverse hand supports 32c, which are arranged alternately in the longitudinal direction of the longitudinal hand support 20c. Each of the first transverse hand supports 31c and each of the second transverse hand supports 32c have a predetermined length in a horizontal direction perpendicular to the longitudinal hand supports 20c, and is coupled to a longitudinal hand support 20c to extend laterally inward from the longitudinal hand support. In the present embodiment, the first transverse hand supports 31c and the second transverse hand supports 32c are plate-like members each having a constant width and a constant thickness. The first transverse hand supports 31c and the second transverse hand supports 32c are arranged at regular intervals in the longitudinal direction of the longitudinal hand supports 20c. The base 10, the longitudinal hand supports 20c, the first transverse hand supports 31c and the second transverse hand supports 32c are formed of a hard resin, ceramics, or a metal such as aluminum.

Figure 10:
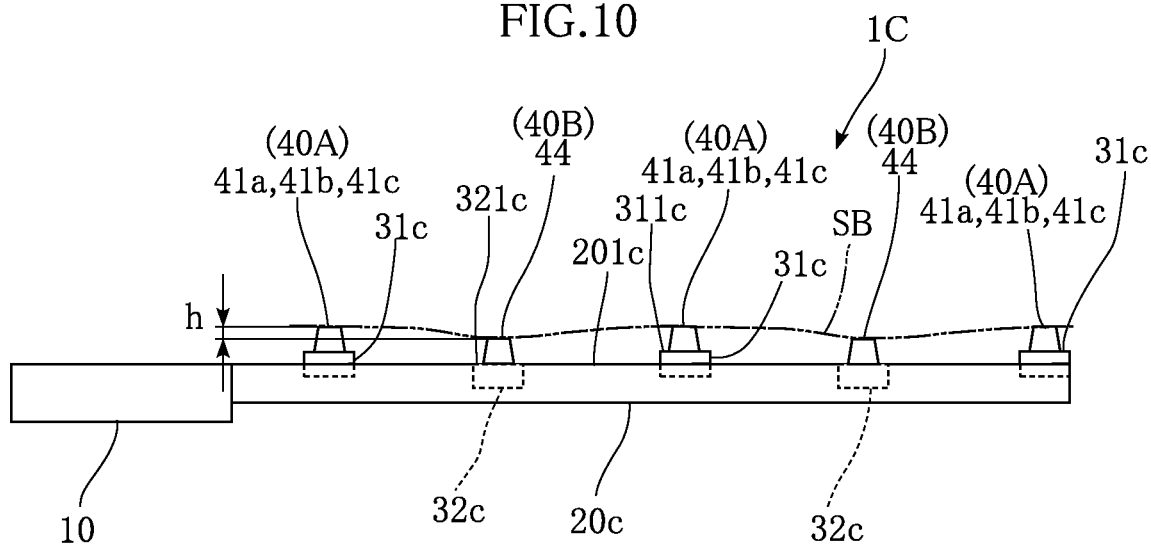
FIG. 10 is a view along line X-X in FIG. 9.

The first transverse hand supports 31c are located higher than the second transverse hand supports 32c by a predetermined height h (FIG. 10). In the present embodiment, each of the first transverse hand supports 31c has a base end of which lower side is cut out to form an L shape, and is coupled to a longitudinal hand support 20c in such a manner that the cut-out part comes into contact with the upper surface 201c and a side surface of the longitudinal hand support 20c. Thus, the upper surfaces 311c of the first transverse hand supports 31c are located higher than the upper surfaces 201c of the longitudinal hand supports 20c. On the other hand, each of the second transverse hand supports 32c is coupled to a longitudinal hand support 20c in such a manner that its upper surface 321c is flush with the upper surface 201c of the longitudinal hand support 20c. Thus, the upper surfaces 311c of the first transverse hand supports 31c are located higher than the upper surfaces 321c of the second transverse hand supports 32c.

The first transverse hand supports 31c and the second transverse hand supports 32c are provided with pins 41a, 41b, 41c, 42, 43 and 44 projecting from the hand supports. These pins serve as contact points with a substrate SB placed on the substrate transfer hand 1C. Similarly to the above-described first and the second embodiments, these pins 41a, 41b, 41c, 42, 43 and 44 may be formed of, for example, resin, rubber, or the like, and it is desirable to form these pins from a material having a suitable elasticity. Each of the first transverse hand supports 31c is provided with three pins 41a, 41b and 41c at three positions, namely at the base end, the distal end and the center in its longitudinal direction. The position of each pin 41a at the base end overlaps a longitudinal hand support 20c. These three pins 41a, 41b and 41c have the same height dimension and their tops function as first contact points 40A according to the present invention. Each of the second transverse hand supports 32c is provided with two pins 42 and 43 at its distal end and the center in its longitudinal direction. Each of the longitudinal hand supports 20c, which adjoins the base ends of the second transverse hand supports 32c, is also provided with pins 44. The pins 44 on the longitudinal hand supports 20c and the pins 43 at the distal ends of the second transverse hand support 32c have the same height dimension. Further, these pins 43 and 44 are identical with, and hence, have the same height dimension as the three pins 41a, 41b and 41c provided at each first transverse hand support 31c. However, since the second transverse hand supports 32c are located lower than the first transverse hand supports 31c by the predetermined height h as described above, the tops of the pins 43 and 44 are located lower than the tops of the pins 41a, 41b and 41c (the first contact points 40A) provided at the first transverse hand supports 31c. The tops of these two pins 43 and 44 function as the second contact points 40B according to the present invention. Note that, in the present embodiment, the height of the pin 42 provided at the center of each second transverse hand support 32c is set lower than the top height position of the two pins 43 and 44 constituting the second contact points 40B.

The advantages of the substrate transfer hand 1C according to the present embodiment are described below.

Figure 11:
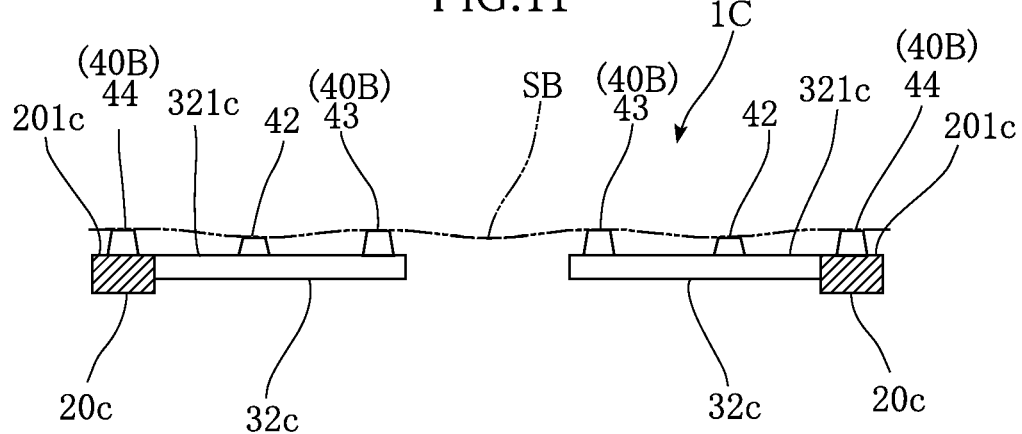
FIG. 11 is a sectional view taken along line XI-XI in FIG. 9.
Figure 12:
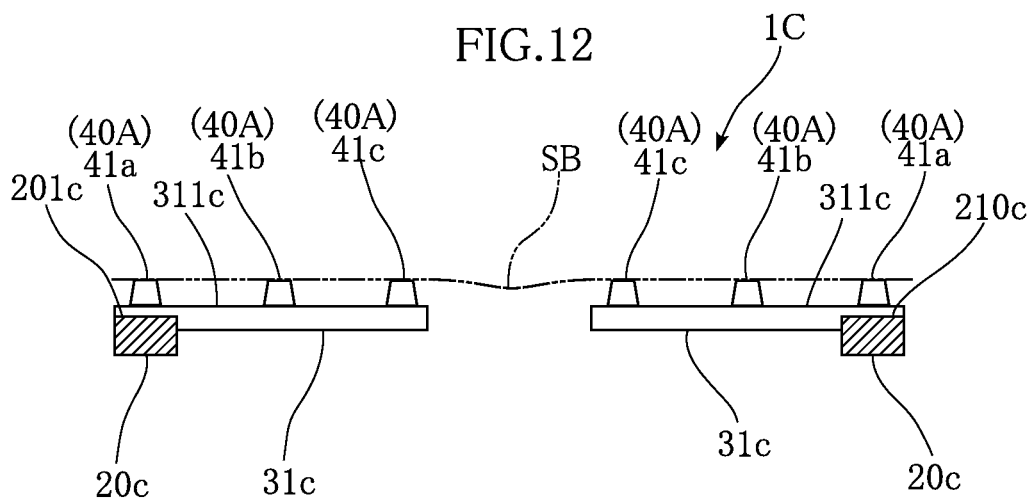
FIG. 12 is a sectional view taken along line XII-XII in FIG. 9.

When a substrate SB is placed onto the substrate transfer hand 1C according to the present embodiment, the top ends of the plurality of pins 41a, 41b, 41c, 42, 43 and 44 provided at the first and the second transverse hand supports 31c and 32c or the longitudinal hand supports 20c come into contact with the substrate SB. Since the top ends of the pins 41a, 41b, 41c, 42, 43 and 44, i.e., the contact points with the substrate SB include the first contact points 40A located at a high position and the second contact points 40B located lower than the first contact points, the substrate SB is supported in an intentionally warped state in contact with the tops of the pins 41a, 41b, 41c, 42, 43 and 44. The first transverse hand supports 31c having the first contact points 40A and the second transverse hand supports 32c having the second contact points 40B lower than the first contact points are arranged alternately in the longitudinal direction of the longitudinal hand supports 20c. With such an arrangement, as shown in FIG. 10, the supported substrate SB is warped or deformed into a waveform, in side view of the substrate transfer hand 1C. Further, a gap is provided between the two longitudinal hand supports 20c and between the respective distal ends of the transverse hand supports 31c and 32c coupled to the longitudinal hand supports, and of the three pins 42, 43 and 44 aligned along each second transverse hand support 32c, the top of the pin 42 at the center is lower than the tops of the pin 44 on the longitudinal hand support 20c and the pin 43 at the distal end of the second transverse hand support 32c. Thus, as shown in FIG. 11, in the cross section along the second transverse hand support 32c again, the substrate is warped or deformed into a waveform. Such warping or deformation provides the substrate SB with certain rigidity, allowing the substrate to be held in a stable condition on the substrate transfer hand 1C. Thus, generation of vibration on the substrate SB during the movement of the substrate transfer hand 1C is eliminated or reduced. Since the substrate SB is supported by the top ends of a relatively small number of pins 41a, 41b, 41c, 42, 43 and 44, the risk of electrostatic discharge (ESD) is not increased.

Figure 13:
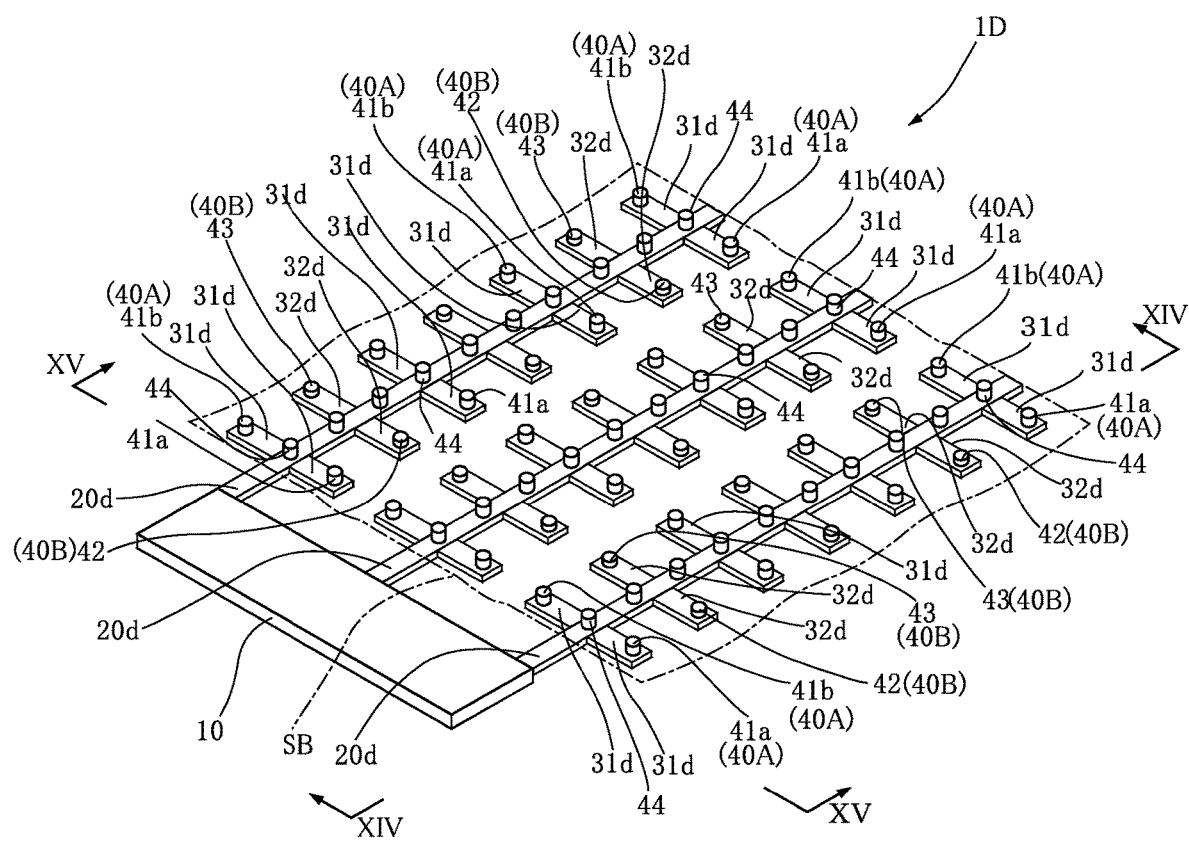
FIG. 13 is an overall perspective view of a substrate transfer hand according to a fourth embodiment of the present invention.
Figure 14:
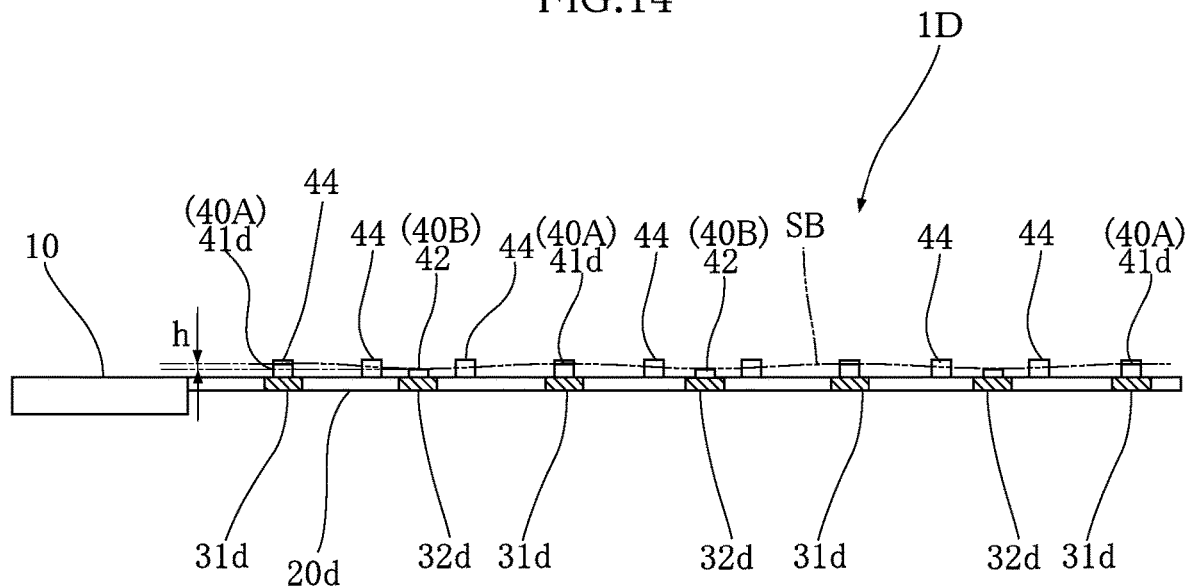
FIG. 14 is a sectional view taken along line XIV-XIV in FIG. 13.
Figure 15:
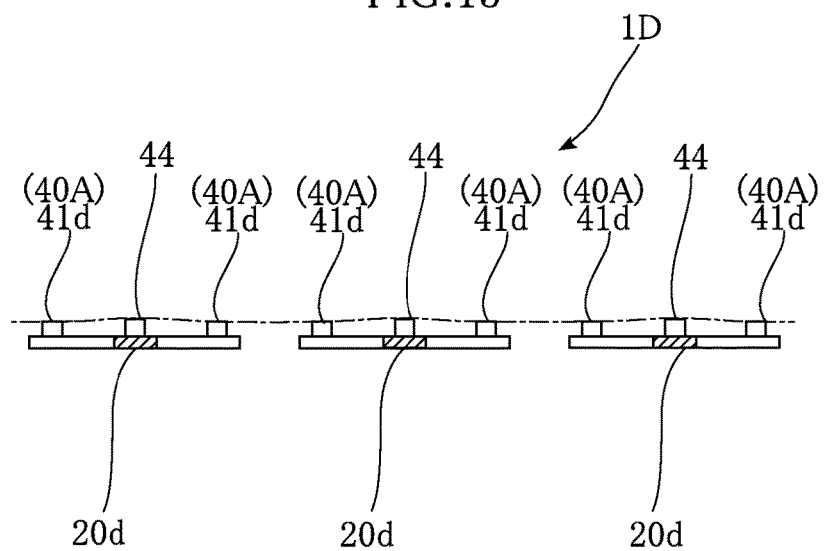
FIG. 15 is a sectional view taken along line XV-XV in FIG. 14.

FIGS. 13-15 show a substrate transfer hand 1D according to a fourth embodiment of the present invention. In these figures, the elements that are identical or similar to those of the substrate transfer hand 1A according to the first embodiment shown in FIGS. 1-4 are designated by the same reference signs as those used for the first embodiment.

The substrate transfer hand 1D includes a base 10, longitudinal hand supports 20d, and a plurality of first transverse hand supports 31d and second transverse hand supports 32d coupled to each of the longitudinal hand supports 20d.

The base 10 is in the form of a horizontal plate having a predetermined width and mounted to a moving means such as an articulated robot RB. The longitudinal hand supports 20d extend from the base 10 linearly within a horizontal plane in a longitudinal direction. In the present embodiment, three longitudinal hand supports 20d extend in parallel to each other at regular intervals. In the present embodiment, the longitudinal hand supports 20d are flat, bar-like members each having a constant width and a constant thickness. To each of the longitudinal hand supports 20d is coupled a plurality of first transverse hand supports 31d and a plurality of second transverse hand supports 32d, which are arranged alternately in the longitudinal direction of the longitudinal hand support 20d. Each of the first transverse hand supports 31d and each of the second transverse hand supports 32d have a predetermined length in a horizontal direction perpendicular to the longitudinal hand supports 20d, and is coupled to a longitudinal hand support 20d to extend laterally in opposite directions from the longitudinal hand support 20d. In the present embodiment, the first transverse hand supports 31d and the second transverse hand supports 32d are plate-like members each having a constant width and a constant thickness, and their upper surfaces are flush with the upper surfaces of the longitudinal hand supports 20d. The first transverse hand supports 31d and the second transverse hand supports 32d are arranged at regular intervals in the longitudinal direction of the longitudinal hand supports 20d. The base 10, the longitudinal hand supports 20d, the first transverse hand supports 31d and the second transverse hand supports 32d are formed of a hard resin, ceramics, or a metal such as aluminum. The longitudinal hand supports 20d and the transverse hand supports 31d and 32d may be formed integrally with each other.

The first transverse hand supports 31d and the second transverse hand supports 32d are provided with pins 41a, 41b, 41c, 42 and 43 projecting from the hand supports. These pins serve as contact points with a substrate SB placed on the substrate transfer hand 1D. These pins 41a, 41b, 41c, 42 and 43 may be formed of, for example, resin, rubber, or the like. It is desirable to form these pins from a material having a suitable elasticity. Each of the first transverse hand supports 31d, which extends laterally in opposite directions from a same position in the longitudinal direction of the longitudinal hand support 20d, is provided with two pins in total, one at each end, i.e., the pins 41a and 41b. These two pins 41a and 41b have the same height dimension and their tops function as first contact points 40A according to the present invention. Each of the second transverse hand supports 32d, which is arranged alternately with a first transverse hand support 31d and extends laterally in opposite directions from a same position in the longitudinal direction of the longitudinal hand support 20d, is provided with two pins in total, one at each end, i.e., the pins 42 and 43. These pins 42 and 43 have the same dimension, which is lower than the height dimension of the pins 41a and 41b provided at the first transverse hand supports 31d. The tops of these two pins 42 and 43 function as the second contact points 40B according to the present invention. Thus, the first contact points 40A are located higher than the second contact points 40B by a predetermined height h.

In the present embodiment, the longitudinal hand supports 20d are also provided with pins 44 projecting from their upper surfaces, which are formed of resin, rubber or the like, similarly to the pins 41a, 41b, 42 and 43. The pins 44 have tops that function as third contact points and are provided at regular intervals in the longitudinal direction of the longitudinal hand support 20d. In the present embodiment, the pins 44 are provided at positions corresponding to the first transverse hand supports 31d and at positions that divide the distance between two adjacent first transverse hand supports 31d equally into three parts. In the present embodiment, the pins 44 have the same height dimension, which is higher than that of the pins 41a and 41b provided at the first transverse hand supports 31d and forming the first contact points 40A.

The advantages of the substrate transfer hand 1D according to the present embodiment are described below.

When a substrate SB is placed onto the substrate transfer hand 1D according to the present embodiment, the top ends of the plurality of pins 41a, 41b, 42, 43 and 44 provided at the first transverse hand supports 31d, the second transverse hand supports 32d or the longitudinal hand supports 20d come into contact with the substrate SB. Since the top ends of the pins 41a, 41b, 42, 43 and 44, i.e., the contact points with the substrate SB include the first contact points 40A located at a high position and the second contact points 40B located lower than the first contact points, the substrate SB is supported in an intentionally warped state in contact with the tops of the pins 41a, 41b, 42, 43 and 44. The first transverse hand supports 31d having the first contact points 40A and the second transverse hand supports 32d having the second contact points 40B lower than the first contact points at their opposite ends are arranged alternately in the longitudinal direction of the longitudinal hand support 20d. Further, the height dimension of the pins 44 (third contact points) provided at the longitudinal hand supports 20d is higher than that of the pins 41a and 41b forming the first contact points 40A and that of the pins 42 and 43 forming the second contact points. With such an arrangement, as shown in FIGS. 14 and 15, the substrate SB in the supported state is warped in such a manner that the portions near the top ends of the second transverse hand supports 32d are low in the section in a side view direction as well as in the cross section. Such warping or deformation provides the substrate SB with certain rigidity, allowing the substrate to be held in a stable condition on the substrate transfer hand 1D. Thus, generation of vibration on the substrate SB during the movement of the substrate transfer hand 1D is eliminated or reduced. Since the substrate SB is supported by the top ends of a relatively small number of pins 41a, 41b, 42, 43 and 44, the risk of electrostatic discharge (ESD) is not increased.

Figure 16:
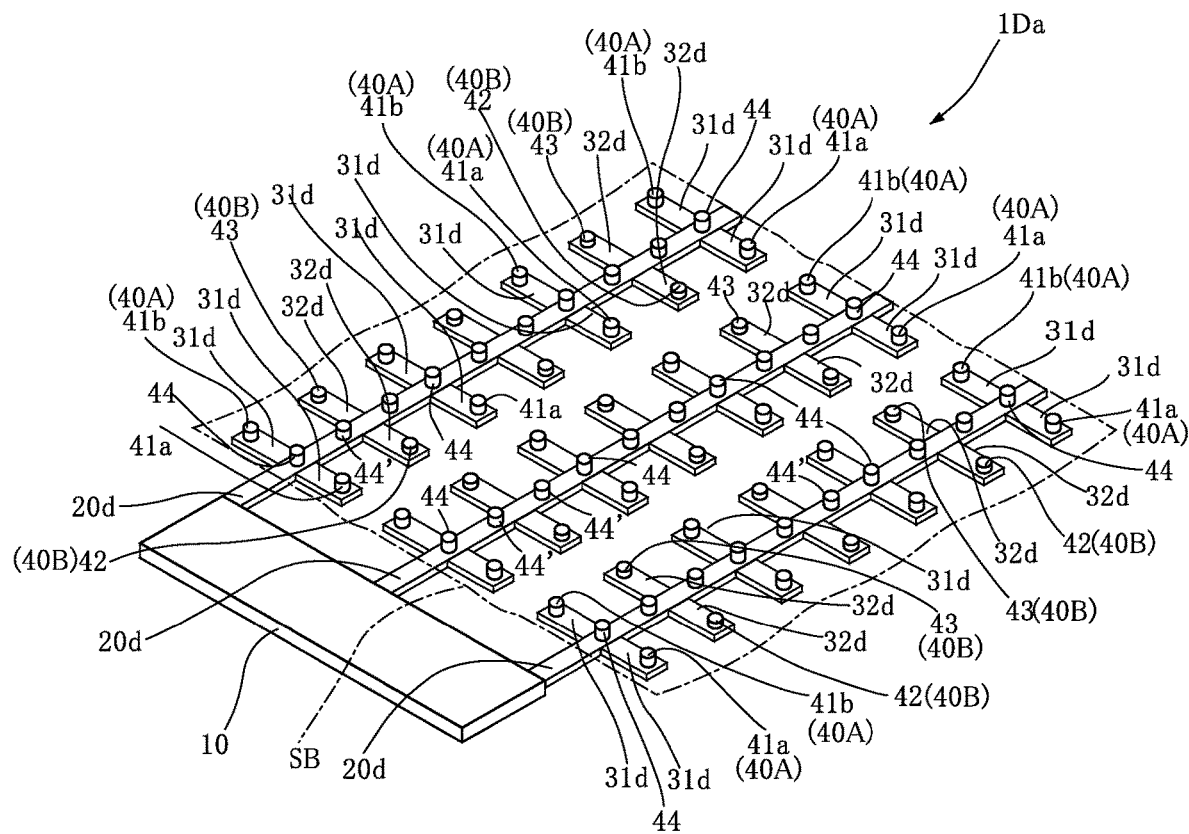
FIG. 16 is a perspective view of a variation of the substrate transfer hand shown in FIG. 13.

FIG. 16 shows a variation 1Da of the substrate transfer hand 1D according to the fourth embodiment. In the substrate transfer hand 1D according to the fourth embodiment, the pins 44 provided at the longitudinal hand supports 20d are equal in height. In the substrate transfer hand 1Da according to this variation, the pins 44 have different heights in the longitudinal direction of the longitudinal hand support 20d. For example, relative to the height of the pins 44 at positions corresponding to the first transverse hand supports 31d or the second transverse hand support 32d, the height of the pins 44' provided between these pins 44 may be set lower. With such a substrate transfer hand 1Da again, the substrate is warped in such a manner that the portions near the top ends of the second transverse hand supports 32d are low in the section in a side view direction as well as in the cross section, which provides the same advantages as those of the substrate transfer hand 1D.

Figure 17:
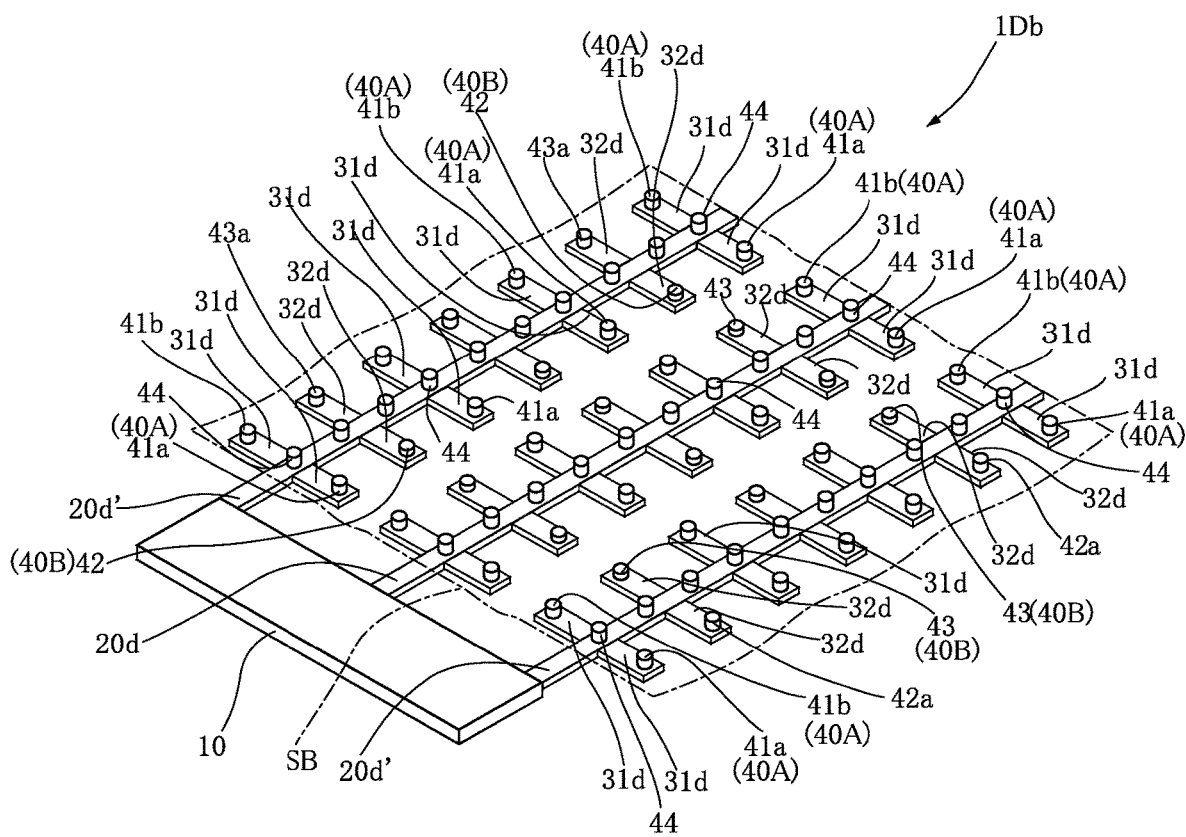
FIG. 17 is a perspective view of another variation of the substrate transfer hand shown in FIG. 13.

FIG. 17 shows another variation 1Db of the substrate transfer hand 1D according to the fourth embodiment. In the substrate transfer hand 1D according to the fourth embodiment, all the pins 43 and 43 provided at the second transverse hand supports 32d have the same height dimension. In the substrate transfer hand 1Db according to this variation, for the two laterally opposite longitudinal hand supports 20d' of the three longitudinal hand supports 20d, the height dimension of the pins 42a and 43a provided at the laterally outer transverse hand supports is set higher, for example, to be equal to that of the pins 41a and 41b provided at the first transverse hand supports 31d. With such a substrate transfer hand 1Db again, the substrate is warped in such a manner that the portions near the top ends of the second transverse hand supports 32d provided with the above-described pins 42 and 43 are low in the section in a side view direction as well as in the cross section, which provides the same advantages as those of the substrate transfer hand 1D.

Figure 18:
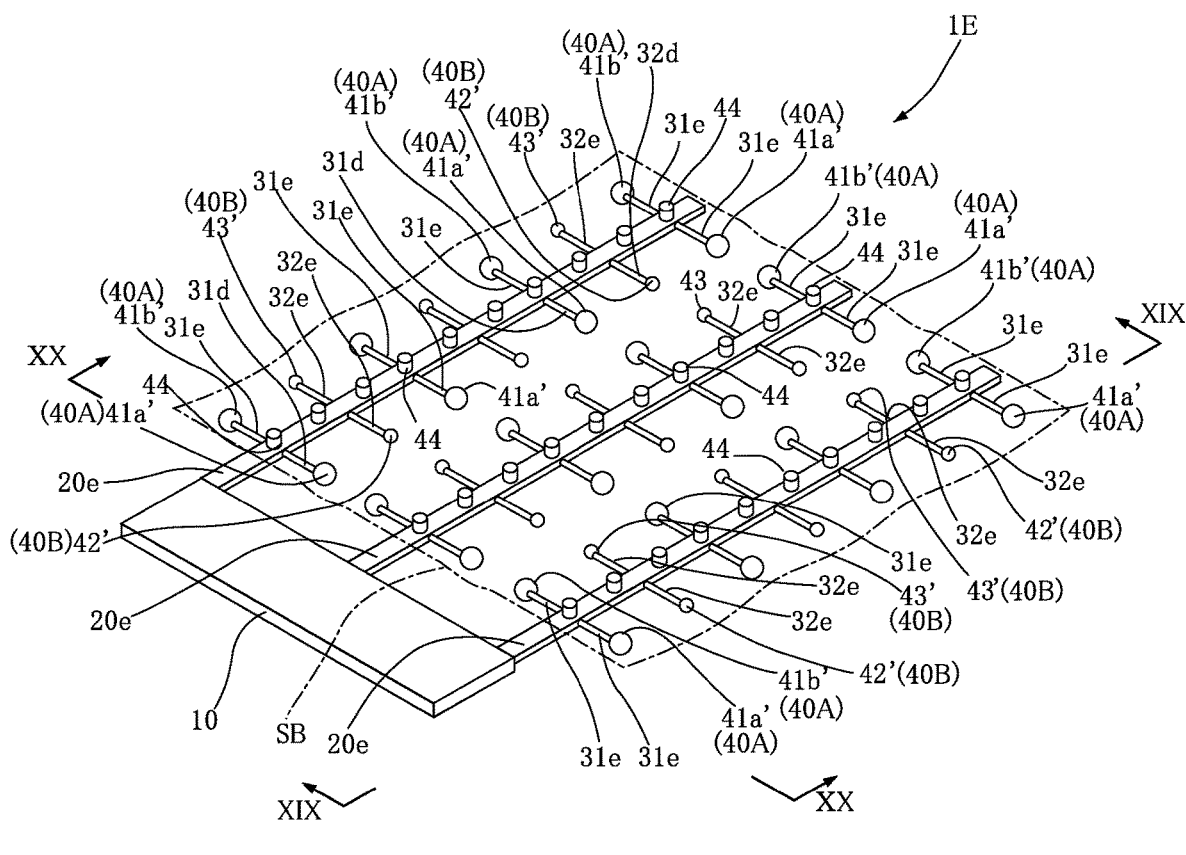
FIG. 18 is an overall perspective view of a substrate transfer hand according to a fifth embodiment of the present invention.
Figure 19:
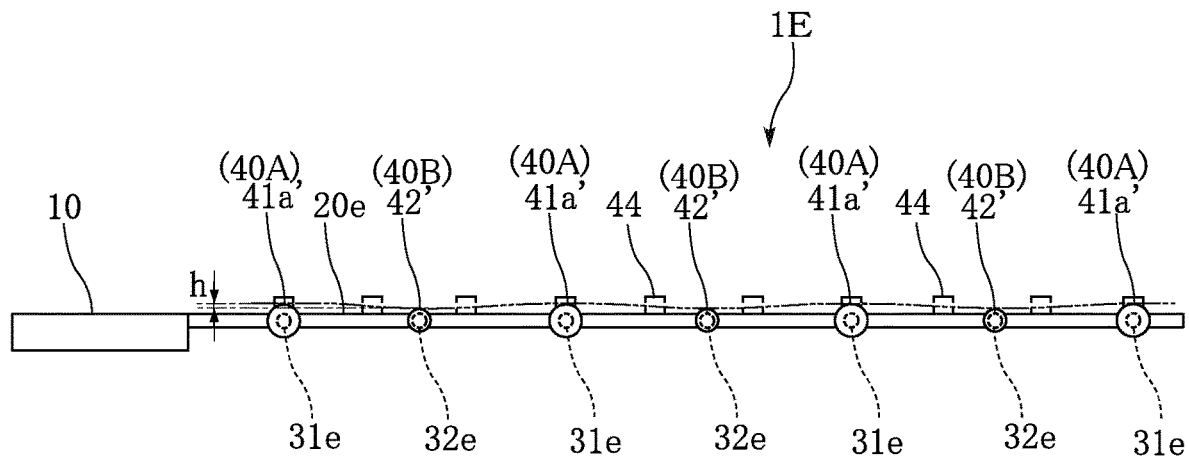
FIG. 19 is a sectional view taken along line XIX-XIX in FIG. 18.
Figure 20:
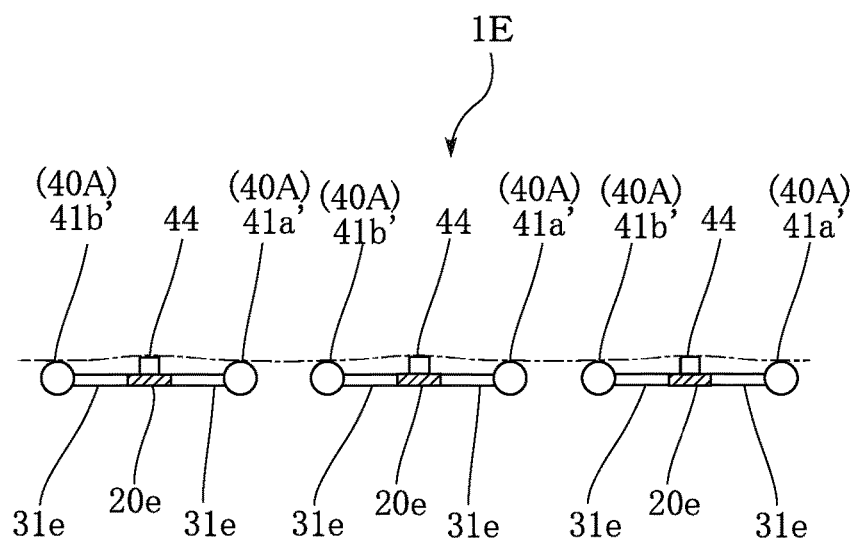
FIG. 20 is a sectional view taken along line XX-XX in FIG. 18.

FIGS. 18-20 show a substrate transfer hand 1E according to a fifth embodiment of the present invention. In these figures, the elements that are identical or similar to those of the substrate transfer hand 1A according to the first embodiment shown in FIGS. 1-4 are designated by the same reference signs as those used for the first embodiment.

The substrate transfer hand 1E includes a base 10, longitudinal hand supports 20e, and a plurality of first transverse hand supports 31e and second transverse hand supports 32e coupled to each of the longitudinal hand supports 20e. The substrate transfer hand 1E according to this embodiment is similar in overall structure to the substrate transfer hand 1D according to the fourth embodiment, but different in specific configuration for forming the first contact points 40A and the second contact points 40B.

In the present embodiment, the first transverse hand supports 31e and the second transverse hand supports 32e are in the form of a rod extending laterally from a side surface of a longitudinal hand support 20e. Similarly to the longitudinal hand supports 30e, the first transverse hand supports 31e and the second transverse hand supports 32e are formed of a hard resin, ceramics, or a metal such as aluminum.

The first transverse hand supports 31e and the second transverse hand supports 32e have ends provided with large diameter portions 41a', 41b', 42' and 43' that serve as contact points with a substrate SB placed on the substrate transfer hand 1E. In the present embodiment, these large diameter portions 41a', 41b', 42' and 43' have a spherical shape. These large diameter portions 41a', 41b', 42' and 43' may be formed integrally with the first transverse hand supports 31e or the second transverse hand supports 32e using the same material as that for these hand supports, but may be formed of an elastic material such as resin or rubber. The large diameter portions 41a' and 41b' formed at the first transverse hand supports 31e have a diameter larger than that of the large diameter portions 42' and 43' formed at the second transverse hand supports 32e. Thus, the tops of the large diameter portions 41a' and 41b' function as the first contact points 40A according to the present invention, whereas the tops of the large diameter portions 42 and 43 function as the second contact points 40B according to the present invention. The first contact points 40A are located higher than the second contact points 40B by a predetermined height h. Although the first contact points 40A and the second contact points 40B are provided by the large diameter portions 41a', 41b', 42' and 43' in the present embodiment, the specific configuration of the first and the second contact points is not limitative, and any other forms of bulging portions may be employed as long as they have upward projections.

Similarly to the substrate transfer hand 1D according to the fourth embodiment, the longitudinal hand supports 20e are provided with pins 44 projecting from their upper surfaces and having tops that function as third contact points. In the present embodiment, all the pins 44 have the same height dimension, and their tops are located higher than the first contact points 40A provided at the first transverse hand supports 31e.

The advantages of the substrate transfer hand 1E according to the present embodiment are described below.

When a substrate SB is placed onto the substrate transfer hand 1E according to the present embodiment, the large diameter portions 41a', 41b', 42' and 43' provided at the first transverse hand supports 31e or the second transverse hand supports 32e and the tops of the pin 44 provided at the longitudinal hand supports 20e come into contact with the substrate SB. Since the contact points with the substrate SB include the first contact points 40A located at a high position and the second contact points 40B located lower than the first contact points, the substrate SB is supported in an intentionally warped state in contact with the tops of the large diameter portions 41a', 41b', 42' and 43' and of the pins 44. The first transverse hand supports 31e having the first contact points 40A and the second transverse hand supports 32e having the second contact points 40B lower than the first contact points at their opposite ends are arranged alternately in the longitudinal direction of the longitudinal hand support 20e. Further, the height dimension of the pins 44 (third contact points) provided at the longitudinal hand support 20e is higher than the tops of the large diameter portions 41a' and 41b' forming the first contact points 40A and the tops of the large diameter portions 42' and 43' forming the second contact points 40B. With such an arrangement, as shown in FIGS. 19 and 20, the substrate SB in the supported state is warped in such a manner that the portions near the top ends of the second transverse hand supports 32e are low in the section in a side view direction as well as in the cross section. Such warping or deformation provides the substrate SB with certain rigidity, allowing the substrate to be held in a stable condition on the substrate transfer hand 1E. Thus, generation of vibration on the substrate SB during the movement of the substrate transfer hand 1E is eliminated or reduced. Since the substrate SB is supported by the tops of a relatively small number of large diameter portions 41a', 41b', 42' and 43' and of the pins 44, the risk of electrostatic discharge (ESD) is not increased.

Figure 21:
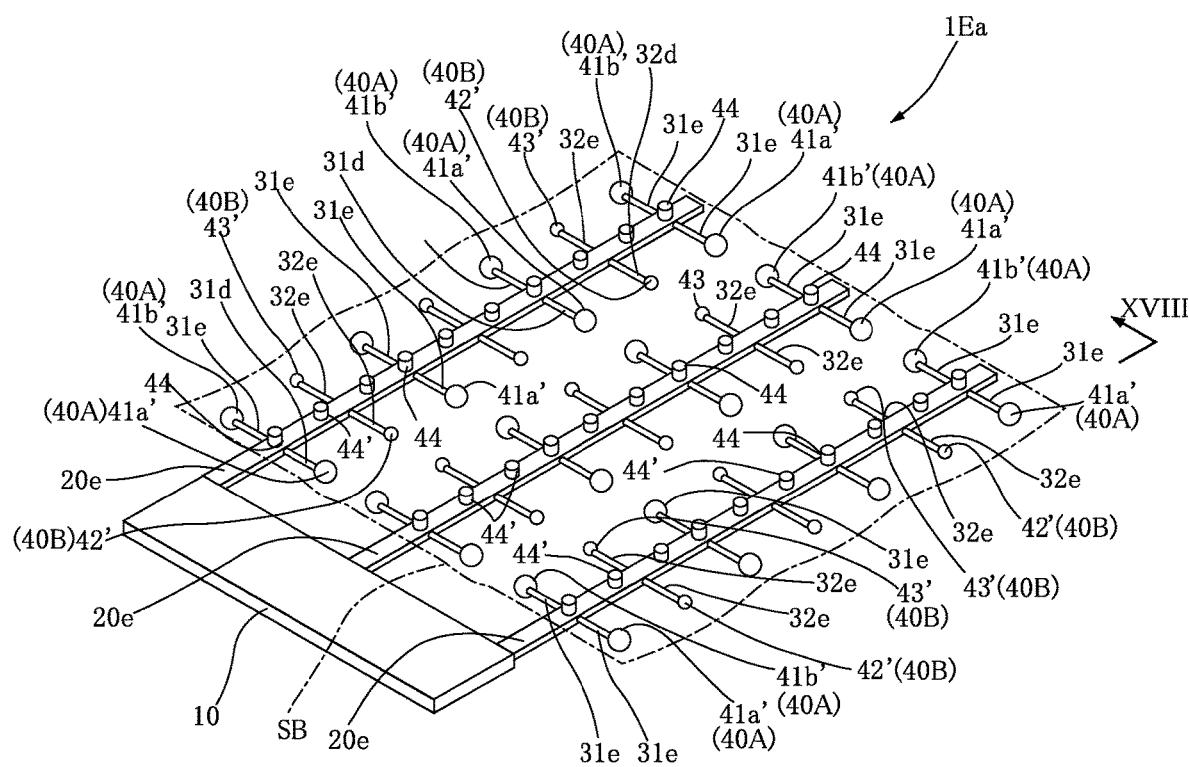
FIG. 21 is a perspective view of a variation of the substrate transfer hand shown in FIG. 18.

FIG. 21 shows a variation 1Ea of the substrate transfer hand 1E according to the fifth embodiment. In the substrate transfer hand 1E according to the fifth embodiment, the pins 44 provided at the longitudinal hand supports 20e are equal in height. In the substrate transfer hand 1Ea according to this variation, the pins 44 have different heights in the longitudinal direction of the longitudinal hand support 20e. For example, relative to the height of the pins 44 at positions corresponding to the first transverse hand supports 31e or the second transverse hand support 32e, the height of the pins 44' provided between these pins 44 may be set lower. With such a substrate transfer hand 1Ea again, the substrate is warped in such a manner that the portions near the top ends of the second transverse hand supports 32e are low in the section in a side view direction as well as in the cross section, which provides the same advantages as those of the substrate transfer hand 1E.

Figure 22:
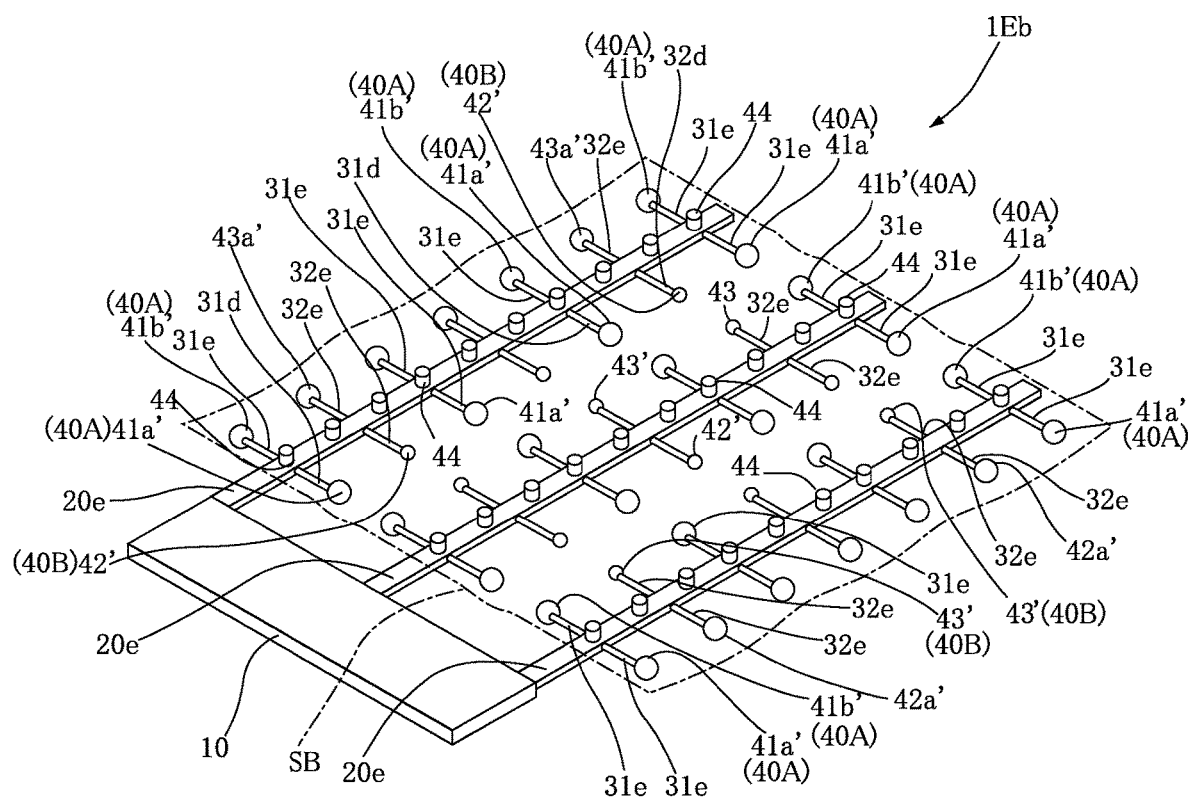
FIG. 22 is a perspective view of another variation of the substrate transfer hand shown in FIG. 18.

FIG. 22 shows another variation 1Eb of the substrate transfer hand 1E according to the fifth embodiment. In the substrate transfer hand 1E according to the fifth embodiment, all the large diameter portions 42' and 43' provided at the second transverse hand supports 32e have the same diameter. In the substrate transfer hand 1Eb according to this variation, for the two laterally opposite longitudinal hand supports 20e' of the three longitudinal hand supports 20e, the diameter of the pins 42a' and 43a' provided at the laterally outer transverse hand supports is set larger, for example, to be equal to that of the large diameter portions 41a' and 41b' provided at the first transverse hand supports 31e. With such a substrate transfer hand 1Eb again, the substrate is warped in such a manner that the portions near the top ends of the second transverse hand supports 32e provided with the above-described pins 42' and 43' are low in the section in a side view direction as well as in the cross section, which provides the same advantages as those of the substrate transfer hand 1E.

The scope of the present invention is not limited to the foregoing embodiments, and any modification in design within the scope set forth in each claim is included in the scope of the present invention.

Each of the foregoing embodiments exemplifies, as the transverse hand supports, first transverse hand supports 31a, 31b, 31c, 31d and 31e having first contact points 40A and second transverse hand supports 32a, 32b, 32c, 32d and 32e having second contact points 40B. However, other transverse hand supports having one or a plurality of other contact points may be provided. When a plurality of contact points are provided at such other transverse hand supports, such contact points may be equal in height to each other or different in height from each other.

Moreover, the heights of the first contact points 40A, the second contact points 40B and other contact points, which may be provided as required, at the longitudinal hand supports 20a, 20b, 20c, 20d and 20e or the transverse hand supports 31a, 31b, 31c, 31d, 31e, 32a, 32b, 32c, 32d and 32e may be set freely based on the degree of warping to be caused intentionally to the substrate SB supported on the substrate transfer hand 1A, 1B, 1C, 1D and 1E in contact with these contact points. In each of the foregoing embodiments, the second contact points 40B provided at the second transverse hand supports 32a, 32b, 32c, 32d and 32e are set to be lowest. However, the third contact points provided at the longitudinal hand supports 20a, 20b, 20c, 20d and 20e may be set to be lowest. Moreover, although the first contact points 40A at the first transverse hand supports 31a, 31b, 31c, 31d and 31e are equal in height in each of the foregoing embodiments, these contact points may differ in height from each other.

All the configurations that intentionally cause the substrate SB supported on the substrate transfer hand 1A, 1B, 1C, 1D or 1E to be warped by the provision of the first contact points 40A and the second contact points 40B are included in the scope of the present invention.

The invention claimed is:

1. A substrate transfer hand for supporting and transferring a substrate, the hand comprising:
   a longitudinal hand support extending in a longitudinal direction and a plurality of transverse hand supports extending from the longitudinal hand support transversely to the longitudinal direction of the longitudinal hand support;

wherein the plurality of transverse hand supports include a plurality of first transverse hand supports and a plurality of second transverse hand supports;

each of the first transverse hand supports includes a first contact capable of contacting the substrate, a maximum height position of the first contact being a first height; and each of the second transverse hand supports includes a second contact capable of contacting the substrate, a maximum height position of the second contact being a second height that is lower than the first height;

at least one of the first contact or the second contact of said each of the first transverse hand supports or said each of the second transverse hand supports comprises at least two contact members capable of contacting the substrate.

2. The substrate transfer hand according to claim 1, wherein the first contact of said each of the first transverse hand supports comprises a top of a pin that projects upward, and the second contact of said each of the second transverse hand supports comprises a top of a pin that projects upward.

3. The substrate transfer hand according to claim 1, wherein the first contact of said each of the first transverse hand supports comprises a top of a bulging portion formed at said each of the first transverse hand supports, whereas the second contact of said each of the second transverse hand supports comprises a top of a bulging portion formed at said each of the second transverse hand supports.

4. The substrate transfer hand according to claim 1, wherein the first transverse hand supports and the second transverse hand supports are arranged alternately in the longitudinal direction.

5. The substrate transfer hand according to claim 4, wherein each of the first transverse hand supports comprises a plurality of first contacts that are equal in height, whereas each of the second transverse hand supports comprises a plurality of second contacts at least one of which has a height lower than the second height.

6. The substrate transfer hand according to claim 1, wherein the longitudinal hand support includes a plurality of third contacts capable of contacting the substrate, a maximum height position of the third contacts being equal to or higher than the second height.

7. The substrate transfer hand according to claim 1, wherein the substrate transfer hand comprises a plurality of longitudinal hand supports.

8. The substrate transfer hand according to claim 7, wherein the substrate transfer hand comprises a pair of longitudinal hand supports that are laterally aligned.

9. The substrate transfer hand according to claim 8, wherein the plurality of transverse hand supports extend laterally outward from each of the longitudinal hand supports.

10. The substrate transfer hand according to claim 8, wherein the plurality of transverse hand supports extend laterally inward from each of the longitudinal hand supports.

11. The substrate transfer hand according to claim 7, wherein the plurality of transverse hand supports extend from each of the longitudinal hand supports laterally in opposite directions.

12. The substrate transfer hand according to claim 1, wherein said each of the first transverse hand supports comprises a first end and a second end that are spaced apart from each other along a length of said each of the first transverse hand supports, and the first contact comprises two contact members disposed at the first end and the second end, respectively.

13. The substrate transfer hand according to claim 12, wherein said each of the first transverse hand supports comprises an upper surface provided with the first contact and a lower surface opposite to the upper surface, the lower surface being in direct contact with the longitudinal hand support.

14. The substrate transfer hand according to claim 12, wherein said each of the first transverse hand supports is fixed at the first end to the longitudinal hand support, and a part of the first end is embedded in the longitudinal hand support in a manner such that an upper surface of said each of the first transverse hand supports is not flush with an upper surface of the longitudinal hand support.

15. The substrate transfer hand according to claim 1, wherein said each of the first transverse hand supports comprises an additional first contact disposed at a location that overlaps with the longitudinal hand support as viewed in plan.

16. The substrate transfer hand according to claim 1, wherein said each of the second transverse hand supports comprises an upper surface provided with the second contact and a lower surface opposite to the upper surface, the upper surface being in direct contact with the longitudinal hand support.

17. The substrate transfer hand according to claim 1, wherein said each of the second transverse hand supports comprises an upper surface provided with the second contact and a lower surface opposite to the upper surface, the upper surface of said each of the second transverse hand supports being flush with an upper surface of the longitudinal hand support.

18. The substrate transfer hand according to claim 1, wherein the plurality of first transverse hand supports and the plurality of second transverse hand supports are supported by the longitudinal hand support and spaced apart from each other in the longitudinal direction.

* * * * *